United States Patent [19]

Inoue et al.

[11] Patent Number: 4,623,864

[45] Date of Patent: Nov. 18, 1986

[54] MAGNETIC FIELD PRODUCTION COIL FOR NUCLEAR MAGNETIC RESONANCE IMAGING APPARATUS

[75] Inventors: Yuji Inoue; Hideto Iwaoka, both of Tokyo, Japan

[73] Assignees: Yokogawa Hokushin Electric Corporation; Yokogawa Medical Systems, Ltd., both of Tokyo, Japan

[21] Appl. No.: 723,142

[22] Filed: Apr. 15, 1985

[30] Foreign Application Priority Data

Apr. 26, 1984 [JP] Japan .................................. 59-84763

[51] Int. Cl.$^4$ ............................................. H01F 5/00
[52] U.S. Cl. ..................................... 335/299; 335/216
[58] Field of Search .................... 335/216, 299, 300; 324/318, 320, 321

[56] References Cited

U.S. PATENT DOCUMENTS

| | | | |
|---|---|---|---|
| 3,281,737 | 10/1966 | Swartz | 335/216 |
| 3,333,331 | 8/1967 | Swartz | 335/216 X |
| 3,440,585 | 4/1969 | Freeman | 335/216 |
| 3,613,006 | 10/1971 | Kantrowitz et al. | 335/216 |

Primary Examiner—George Harris
Attorney, Agent, or Firm—Moonray Kojima

[57] ABSTRACT

A 4 coil type air core coil magnet used for NMR imaging apparatus, wherein each coil assembly comprises a plurality of pancake coil elements in layers, and in each of the coil elements the configuration of a predetermined portion and the winding length of the end portion is selectively controlled and connecting wiring between each coil element is parallel to the axis of the four coil assemblies, whereby highly uniform magnetic fields are obtained.

3 Claims, 13 Drawing Figures

FIG.9(a)
FIG.9(b)
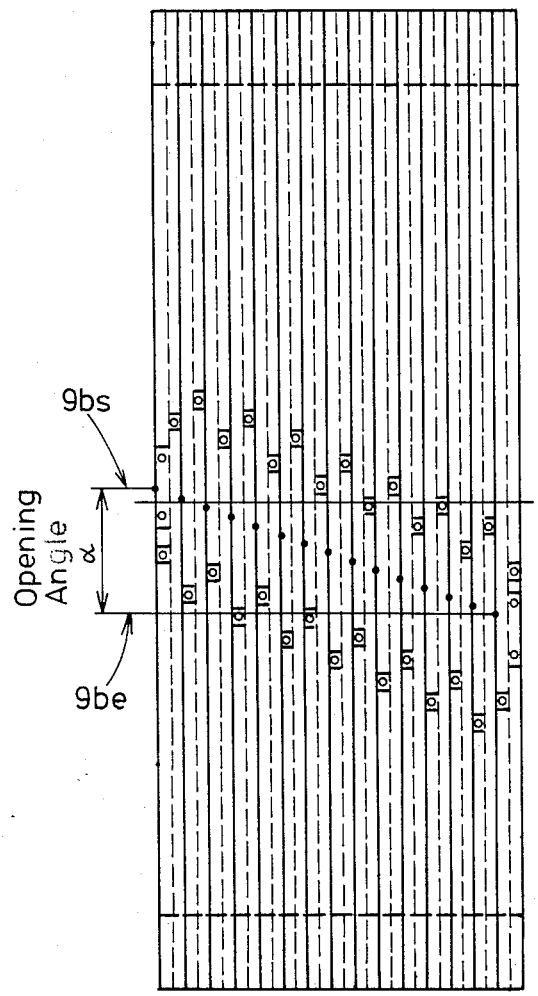
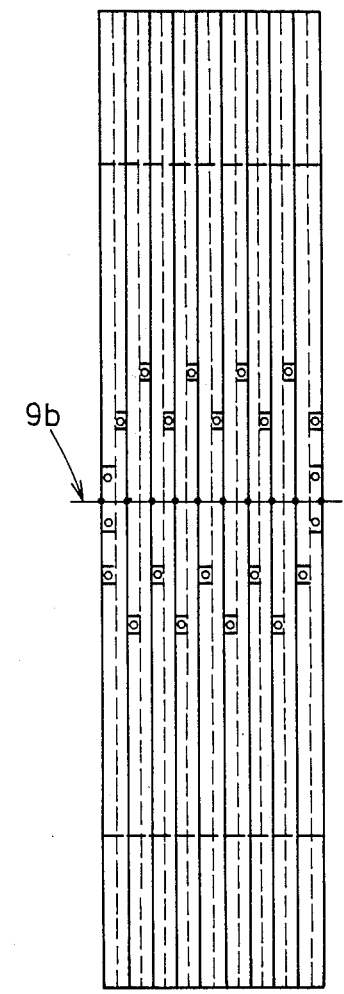

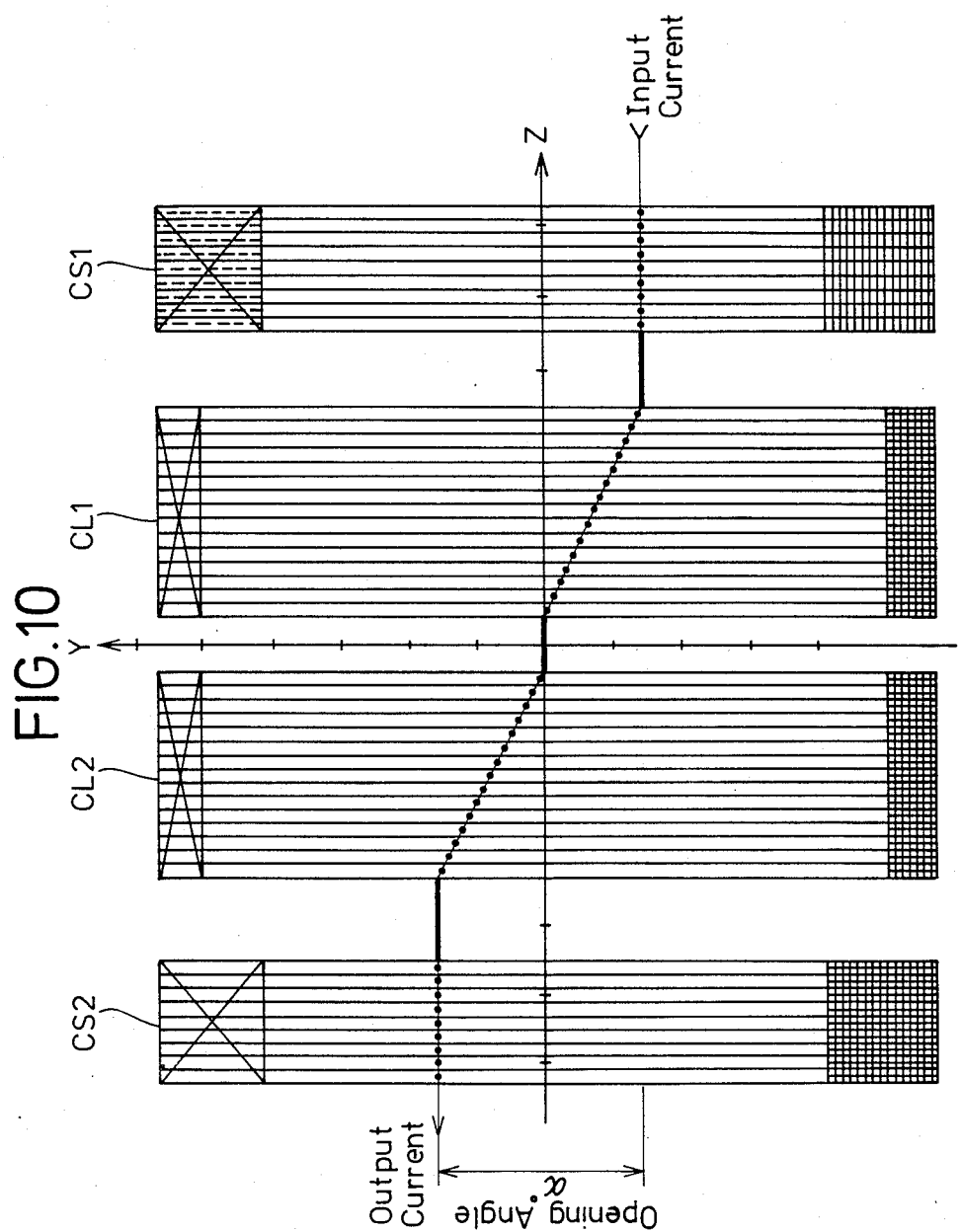

MAGNETIC FIELD PRODUCTION COIL FOR NUCLEAR MAGNETIC RESONANCE IMAGING APPARATUS

BACKGROUND OF THE INVENTION

1. Field of Invention

This invention relates to improvements in the uniformity of air core coil magnets used in nuclear magnetic resonance (known as NMR) imaging devices.

2. Description of the Prior Art

An NMR imaging apparatus obtains a picture of a selected plane in the body of a subject being examined, without invading the body. In this kind of an NMR apparatus, an air core coil is used for the purpose of producing a magnetic field, more particularly a static magnetic field.

Generally, as depicted in FIG. 1, when an air core coil is wound in a single pancake or a double pancake, a wire is wound around a bobbin 1, which may be cylindrical or columnar. Toward the end of the first turn of the wire, a gap 3 exists between the bobbin 1 and the wire. As a result, every succeeding turn of the wire fails to form a completely round surface. (Since the degree of uniformity required for a magnet for NMR is on the order of $10^{-5}$, such a coil can not be handled as a circular ring coil and some corrections are necessary.)

FIG. 2 shows the structure of an example of an air core coil used for an NMR imaging apparatus. Four air core coil assemblies CS1, CS2, CL1 and CL2 are arranged on the same axis, such that the degree of uniformity of the inner space (within the imaging range) is several tens ppm. Each of the air core coil assemblies comprises a plurality of coil elements in layers and each of the coil elements is formed of a wire 2 wound in the manner shown in FIG. 1.

However, if these coil elements are required to have complete roundness, the degree of uniformity in terms of magnetic field is greatly deteriorated from what is planned. As a means of correcting uniformity, there is a method of, for example, using shim coils, but, this method is inconvenient because various combinations of shim coils are required depending on the desired correction of the degree of uniformity.

SUMMARY OF THE INVENTION

Accordingly, an object of the invention is to provide an air core coil for use in NMR apparatuses, which allows for correction of the degree of uniformity in the internal magnetic field of the air core coil by virtue of improvements in the method of coil winding and the method of connecting the wiring between coil elerents applied at the time of laying one coil element on top of another.

To achieve the foregoing and other objects, this invention provides a magnetic field production coil comprising a pair of inner coil assemblies and a pair of outer coil assemblies coaxially arranged on a Z axis at predetermined intervals, wherein each of the coil assemblies comprises a plurality of pancake coil elements arranged in layers; wherein each of the pancake coil elements has a configuration of a spacer which is inserted below a wire toward the end of one turn and is appropriately adjusted; and the winding length of the end of each coil element is adjusted; and wherein the four coil assemblies and each of the coil elements are arranged by rotating them around the Z axis, such that the connection wiring between the end portion of each coil element and the initial protion of the following coil element and the connection wiring between each of the four coil assemblies are parallel to the Z axis, whereby magnetic field of high uniformity is obtained in the internal space of the magnetic field production coil.

BRIEF DESCRIPTION OF THE DRAWINGS

FIGS. 9(a), 9(b) and 10, respectively, are explanatory views of a wire connecting method for double pancake coil elements.

DETAILED DESCRIPTION OF PREFERRED EMBODIMENTS (1) Method of Adjusting the Configuration of a Coil.

Figure 3:
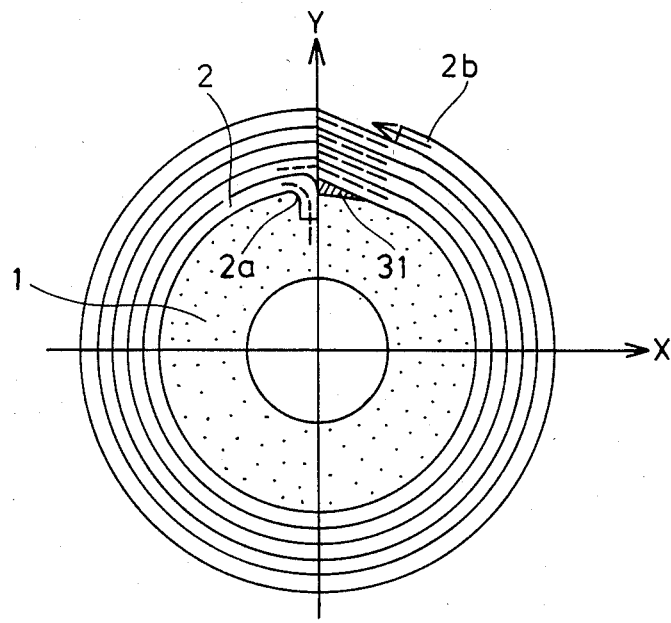
FIG. 3 is an explanatory method of a method of adjusting the configuration of a coil element according to the invention.

In FIG. 3, a spacer 31, which fills the gap below the wire 2 toward the end of its first turn, is attached to bobbin 1. The configuration of the spacer is controlled or selected, such as to have a configuration suitable for correcting the degree of uniformity.

(2) Method of Adjusting the Length of the Wire Winding End.

When the coil element is designed to be a circular ring, wire winding end 2b of the coil element is usually on the same Y axis as the wire winding starting portion 2a. In this invention, however, taking into consideration the fact that the above method (1) alone is not sufficient for obtaining an adequate degree of uniformity in magnetic field, the degree of uniformity is corrected by adjusting the length of the end protion 2b of the coil element.

(3) Method of Arranging Pancake Coil Elements.

Figure 5A:
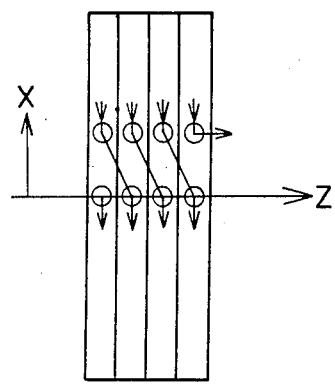
FIGS. 4, 5(a) and 5(b), respectively, are explanatory views of a wire connecting method for pancake coil elements.
Figure 5B:
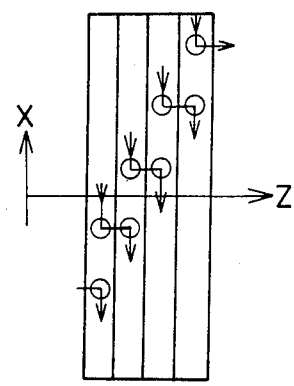
Figure 4:
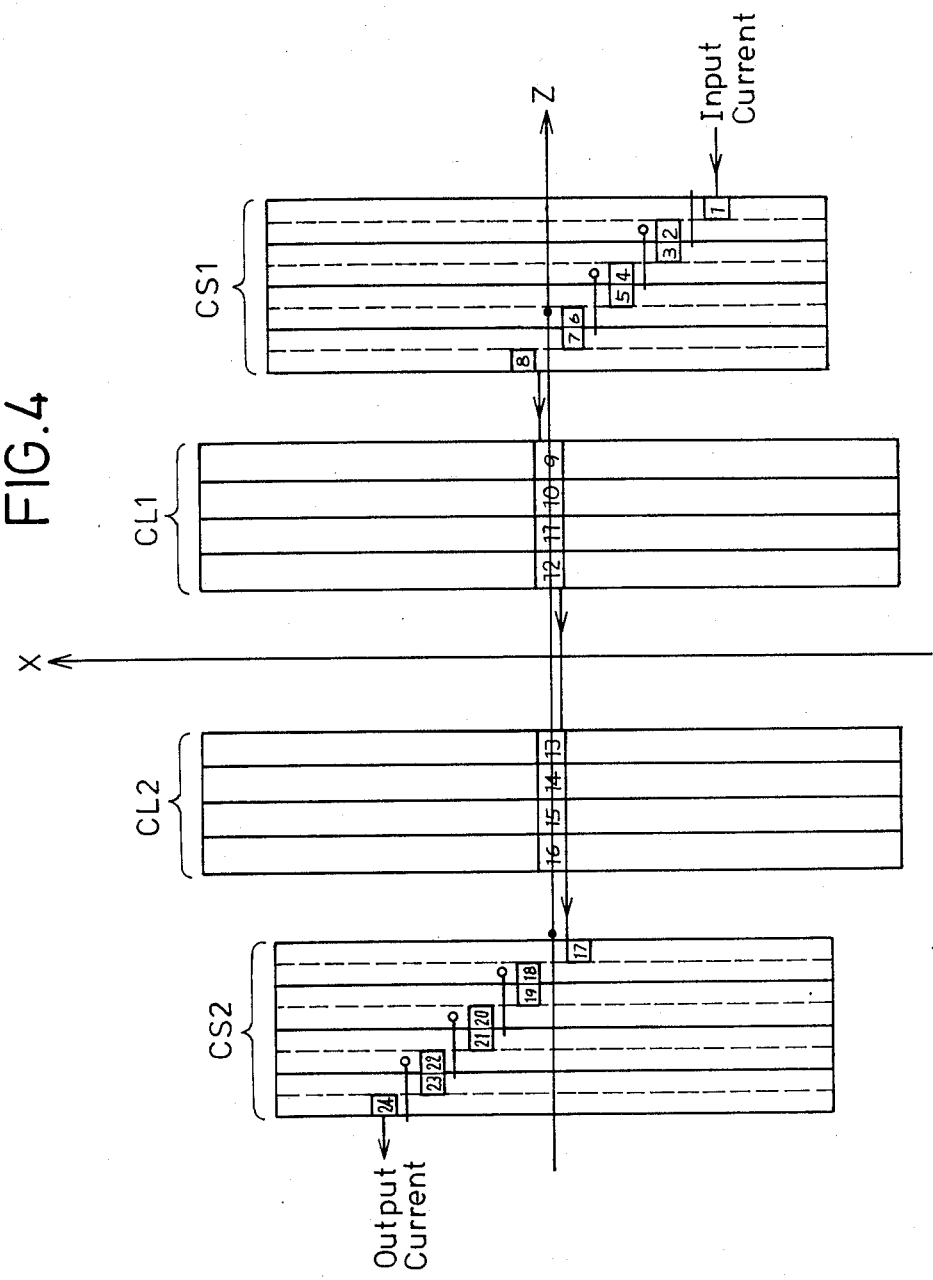

FIG. 4 shows an example of the arrangement of coil elements. It has been confirmed by actual use that in the case of a 4-coil assembly system, the degree of uniformity is improved by locating the wire winding end portion of the coil elements of the coil assemblies CS1 and CS2, shown in FIG. 2, away from Y Axis, as is shown in FIG. 3. If the connecting wiring between each of the four coil elements is arranged such as to be inclined in relation to the Z and X axes, as shown in FIG. 5(a), since the X components of the electric current which flows in the wiring portion is equivalent to the fact that it constitutes a part of the coiled wire, the effect of shortening the end portion of the coiled wire is cancelled. Accordingly, as is shown in FIG. 5(b), the coil elements are arranged such that connecting wiring between two adjacent coil elements is parallel to the Z axis.

By arranging the four coil assemblies such that the end portion of each coil element (the portions indicated by the framed numbers) is positioned symmetrically with respect to the others and with respect to the ZY plane, as is shown in FIG. 4, symmetrical uniformity is obtained on the X and Y axes.

In FIG. 4, the coil assemblies CS1 and CS2 are double pancake coil elements. The wiring for connecting adjacent coil elements (indicated by bars with circles in FIG. 4 which shows that they are the central axis of the double pancakes) is parallel to the Z axis.

Figure 6:
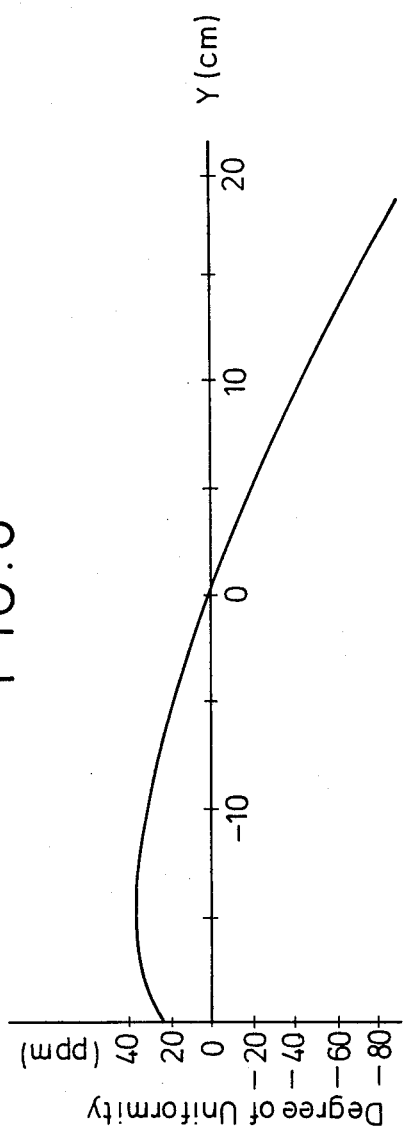
FIGS. 6 and 7, respectively, show the degree of uniformity in magnetic field obtained by a coil according to the invention.
Figure 7:
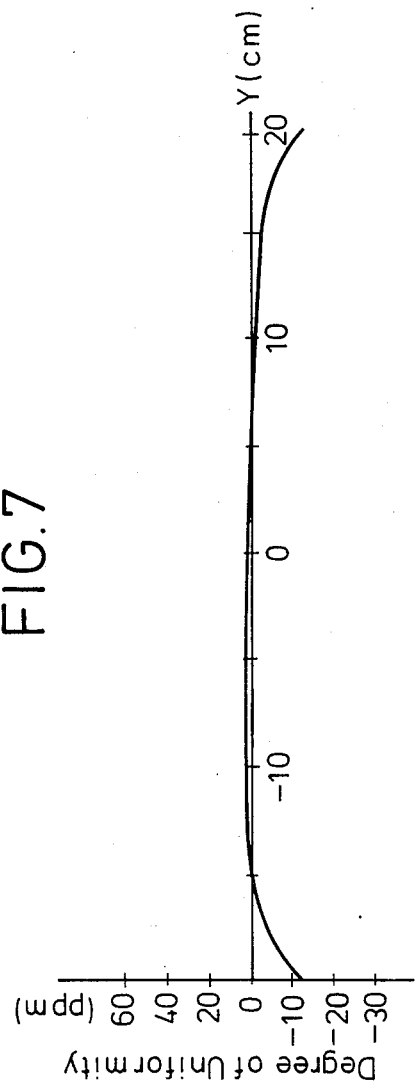

The degree of uniformity in magnetic field which is obtained in this way is shown in FIGS. 6 and 7. In each of the FIGS. 6, 7, the abscissa shows the Y axis ($X=Y=0$), and the ordinate shows the degree of uniformity ($\Delta B/B_0$) in relation to the density $B_0$ of magnetic flux at the center of a coil (0, 0, 0) in units of ppm.

FIG. 6 shows the degree of uniformity obtained when the configuration of spacer 31, shown in FIG. 3, is adjusted. Since the sign of the degree of uniformity in the direction $+Y$ is negative in this case, this can be corrected by making the wire winding end portion of the coiled element (the portion indicated by numeral $2b$ in FIG. 3) slightly longer. FIG. 7 shows the degree of uniformity in magnetic field as a result of this adjustment.

Figure 1:
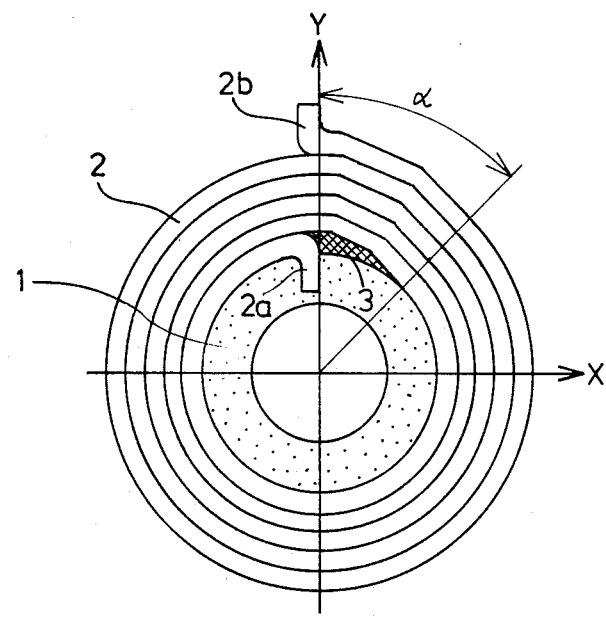
FIG. 1 is an explanatory view depicting the winding state of a pancake coil.
Figure 2:
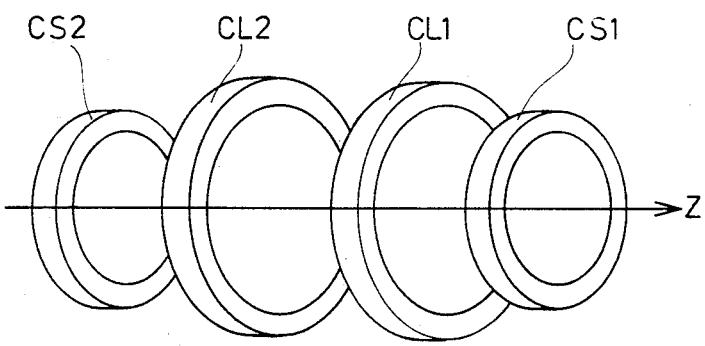
FIG. 2 is a perspective view depicting the structure of a magnet used for nuclear magnetic resonance.

Another embodiment of the invention will now be discussed. As depicted in FIG. 2, the outer coils assemblies CS1 and CS2, each comprises nine coil elements in layers, each of which is a 15-turn double pancake coil element with an inner diameter of about 960 mm. The inner coils CL1 and CL2 both comprise 15 coil elements in layers, each of which is a 7 turn double pancake coil element with an inner diameter of about 1,000 mm. The inner and outer coils are arranged as shown in FIG. 2. The following adjustment and arrangement are applied to each coil element.

Method of Adjusting the Length of the Wire Winding End.

Figure 8A:
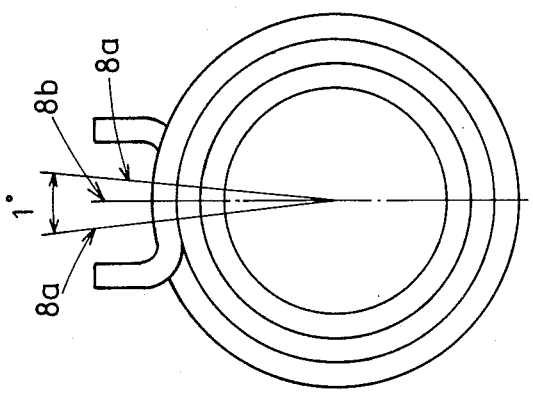
FIGS. 8(a) and 8(b) are explanatory views of a method of adjusting the configuration of a coil element in another embodiment of the invention.
Figure 8B:
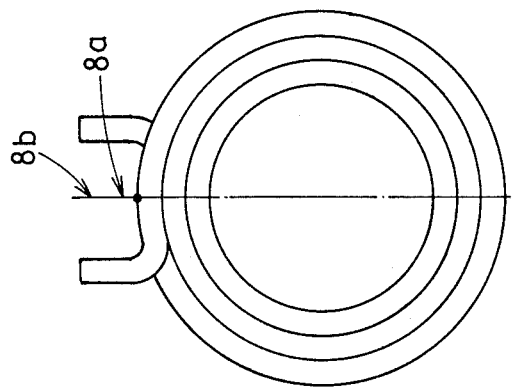

As depicted in FIG. 8($a$), the coil elements are overlaid in such a manner that the opening angle between center position 8$a$ of current connection between each of the coil elements constituting the coil assemblies CL1 and CL2 and the center of transition 8$b$ of each double pancake coil element is 1°.

On the other hand, as depicted in FIG. 8($b$), the coil elements constituting the coil assemblies CS1 and CS2 are overlaid in such a manner that the center position 8$a$ of current connection and the center of transition 8($b$) agree.

By adjusting the opening angle between 8$a$ and 8$b$ in this way, the length of the wire winding end portion of each double pancake coil element is adjusted.

Arrangement of Coil Elements.

As depicted in FIG. 9($a$), the coil elements in the coil assemblies CL1 and CL2 are arranged as shown. Since adjacent double pancake coil elements are connected with an opening angle of 1°, as is shown in FIG. 8($a$), the opening angle $\alpha$ between the center of current connection 9$bs$ of the first double pancake coil element and the center of current connection 9$be$ of the fifteenth double pancake coil element is 15°.

FIG. 9($b$) shows the arrangement of the coil elements in the coil assemblies CS1 and CS2. In this case, the center of current connection between each coil element is parallel to the Z axis.

FIG. 10 shows the structure of coil assemblies CS1, CS2, CL1 and CL2, each of which is produced by overlaying the above described coil elements. The total opening angle $\alpha$ of the center of current connection of the four coil assemblies is 30°.

As described above, this invention is very effective in facilitating practical use of a magnet for nuclear magnetic resonance in that the degree of uniformity of the internal magnetic field can be adjusted by improving the configuration or connecting state of the coil element itself without any need for the addition of a shim coil or the troublesome adjustment of the shim coil.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A magnetic field producing coil comprising a pair of inner coil assemblies and a pair of outer coil assemblies, coaxially arranged on a Z axis at predetermined intervals; wherein each of said coil assemblies comprises a plurality of pancake coil elements in layers; wherein each of said pancake coil elements has inserted therein a spacer configuration below a wire toward an end of one turn thereof, said configuration being appropriately adjusted, and the winding length of an end portion of each coil element is adjusted; wherein said four coil assemblies and each of said coil elements are arranged by rotating same around said Z axis such that the connecting wire between the end portion of each coil element and an initial portion of the following coil element and the connection wiring between each of said four coil assemblies are parallel to said Z axis; whereby magnetic field of high uniformity is obtained in an internal space of said magnetic field producing coil.

2. The coil of claim 1, wherein said pair of inner coils each comprises a plurality of double pancake coil elements in layers, wherein in each of said coil elements, the winding length of said end portion of said coil element is adjusted such that the number of turns is reduced in the range of an opening angle of about 1°, and wherein in said pair of outer coils the end portion of each coil element and the intial portion of the following coil element are at the same position.

3. The coil of claim 1, wherein said pair of outer coils each comprises a plurality of double pancake coil elements in layers, wherein in each of said coil elements, the winding length of said end portion of said coil element is adjusted such that the number of turns is reduced in the range of an opening angle of about 3.5°, and wherein in said pair of inner coils the end portion of each coil element and the initial portion of the following coil element are at the same position.

* * * * *